United States Patent
Shen et al.

(10) Patent No.: US 10,586,759 B2
(45) Date of Patent: Mar. 10, 2020

(54) INTERCONNECTION SUBSTRATES FOR INTERCONNECTION BETWEEN CIRCUIT MODULES, AND METHODS OF MANUFACTURE

(71) Applicant: Invensas Corporation, San Jose, CA (US)

(72) Inventors: Hong Shen, Palo Alto, CA (US); Liang Wang, Newark, CA (US); Gabriel Z. Guevara, Gilroy, CA (US); Rajesh Katkar, Milpitas, CA (US); Cyprian Emeka Uzoh, San Jose, CA (US); Laura Wills Mirkarimi, Sunol, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 16/017,010

(22) Filed: Jun. 25, 2018

(65) Prior Publication Data

US 2018/0337118 A1 Nov. 22, 2018

Related U.S. Application Data

(60) Continuation of application No. 15/403,679, filed on Jan. 11, 2017, now Pat. No. 10,014,243, which is a
(Continued)

(51) Int. Cl.
*H01L 23/498* (2006.01)
*H01L 25/065* (2006.01)
(Continued)

(52) U.S. Cl.
CPC ...... *H01L 23/49822* (2013.01); *H01L 21/486* (2013.01); *H01L 21/4853* (2013.01);
(Continued)

(58) Field of Classification Search
CPC ......... H01L 23/49822; H01L 23/49833; H01L 23/5383; H01L 23/5385
See application file for complete search history.

(56) References Cited

U.S. PATENT DOCUMENTS

| | | |
|---|---|---|
| 4,624,896 A | 11/1986 | Watanabe et al. |
| 5,300,163 A | 4/1994 | Ohtaki |

(Continued)

FOREIGN PATENT DOCUMENTS

EP  1 688 995 A1  8/2006

OTHER PUBLICATIONS

B-Stage Epoxy, Epoxy Technology Inc., 2012, 2 pages.
(Continued)

*Primary Examiner* — Daniel Luke

(57) ABSTRACT

An interposer (110) has contact pads at the top and/or bottom surfaces for connection to circuit modules (e.g. ICs 112). The interposer includes a substrate made of multiple layers (110.i). Each layer can be a substrate (110S), possibly a ceramic substrate, with circuitry. The substrates extend vertically. Multiple interposers are fabricated in a single structure (310) made of vertical layers (310.i) corresponding to the interposers' layers. The structure is diced along horizontal planes (314) to provide the interposers. An interposer's vertical conductive lines (similar to through-substrate vias) can be formed on the substrates' surfaces before dicing and before all the substrates are attached to each other. Thus, there is no need to make through-substrate holes for the vertical conductive lines. Non-vertical features can also be formed on the substrates' surfaces before the substrates are attached to each other. Other embodiments are also provided.

17 Claims, 9 Drawing Sheets

Related U.S. Application Data division of application No. 14/533,728, filed on Nov. 5, 2014, now Pat. No. 9,583,426.

(51) Int. Cl.
    *H01L 21/48* (2006.01)
    *H01L 25/00* (2006.01)
    *H01L 23/00* (2006.01)

(52) U.S. Cl.
    CPC .... *H01L 21/4857* (2013.01); *H01L 23/49805* (2013.01); *H01L 23/49827* (2013.01); *H01L 23/49838* (2013.01); *H01L 24/09* (2013.01); *H01L 24/48* (2013.01); *H01L 25/0655* (2013.01); *H01L 25/50* (2013.01); *H01L 2224/16225* (2013.01); *H01L 2224/48091* (2013.01); *H01L 2224/48227* (2013.01); *H01L 2924/00014* (2013.01); *H01L 2924/15192* (2013.01)

(56) References Cited

U.S. PATENT DOCUMENTS

| | | | |
|---|---|---|---|
| 5,953,816 A | 9/1999 | Pai et al. | |
| 6,555,920 B2 | 4/2003 | Chung et al. | |
| 6,943,108 B2 | 9/2005 | Farooq et al. | |
| 6,970,362 B1 | 11/2005 | Chakravorty | |
| 7,047,637 B2 | 5/2006 | deRochemont et al. | |
| 7,339,798 B2 | 3/2008 | Chakravorty | |
| 7,402,901 B2 | 7/2008 | Hatano et al. | |
| 7,504,271 B2 | 3/2009 | Paladuz | |
| 7,663,206 B2 | 2/2010 | Lee | |
| 7,675,160 B2 | 3/2010 | Dattaguru et al. | |
| 7,833,370 B2 | 11/2010 | Kawamura et al. | |
| 7,964,802 B2 | 6/2011 | Hoffmann et al. | |
| 8,064,224 B2 | 11/2011 | Mahajan et al. | |
| 8,274,149 B2 | 9/2012 | Chang et al. | |
| 8,274,165 B2 | 9/2012 | Sasaki et al. | |
| 8,384,411 B2 | 2/2013 | Mooyman-Beck et al. | |
| 8,390,109 B2 | 3/2013 | Popovic et al. | |
| 8,435,373 B2 | 5/2013 | Slafer | |
| 8,633,858 B2 | 1/2014 | Nair et al. | |
| 8,686,548 B2 | 4/2014 | Arai | |
| 8,723,332 B2 | 5/2014 | McElrea et al. | |
| 8,901,748 B2 | 12/2014 | Manusharow et al. | |
| 8,946,900 B2 | 2/2015 | Qian et al. | |
| 8,988,895 B2 | 3/2015 | Mohammed et al. | |
| 9,119,313 B2 | 4/2015 | Zhang et al. | |
| 9,070,674 B2 | 6/2015 | Gallegos et al. | |
| 9,111,902 B2 | 8/2015 | Savastiouk et al. | |
| 9,147,663 B2 | 9/2015 | Liu et al. | |
| 9,236,366 B2 | 1/2016 | Roy et al. | |
| 9,312,175 B2 | 4/2016 | Raba et al. | |
| 9,349,663 B2 | 5/2016 | Chen et al. | |
| 9,368,425 B2 | 6/2016 | Graf et al. | |
| 9,368,450 B1 | 6/2016 | Gu et al. | |
| 9,374,896 B2 | 6/2016 | Chen et al. | |
| 9,406,532 B2 | 8/2016 | Haba et al. | |
| 9,433,077 B2 | 8/2016 | Brunschwiler et al. | |
| 9,508,636 B2 | 11/2016 | Zhang et al. | |
| 9,633,872 B2 | 4/2017 | Chen et al. | |
| 9,642,259 B2 | 5/2017 | Kim et al. | |
| 9,713,264 B2 | 7/2017 | Rawlings et al. | |
| 9,941,246 B2 | 4/2018 | Deshpande et al. | |
| 2004/0256715 A1 | 12/2004 | Seki | |
| 2007/0004229 A1 | 1/2007 | Malajovich | |
| 2009/0068790 A1 | 3/2009 | Caskey et al. | |
| 2011/0148447 A1 | 6/2011 | Yoo et al. | |
| 2012/0138343 A1* | 6/2012 | Beroz | H01L 21/486 174/254 |
| 2012/0211878 A1 | 8/2012 | Popovic et al. | |
| 2016/0212862 A1 | 7/2016 | Rathbum | |
| 2016/0260688 A1 | 9/2016 | Deshpande et al. | |

OTHER PUBLICATIONS

Ceramic, http://en.wikipedia.org/wiki/Ceramic, retrieved on Jul. 25, 2014, 7 pages.
Ceramic Engineering, http://en.wikipedia.org/wiki/Ceramic_engineering, retrieved on Jul. 25, 2014, 18 pages.
Ceramic Materials, http://en.wikipedia.org/wiki/Ceramic_materials, retrieved on Jul. 25, 2014, 11 pages.
Haavind, B., "Big Push Coming on Two Routes to 3D," Solid State Technology, retrieved on Oct. 31, 2014 at http://electroiq.com/blog/2007/07/big-push-coming-on-two-routes-to-3D, 4 pages.
International Search Report and Written Opinion for PCT Application No. PCT/US2015/058861, dated Feb. 5, 2016, 11 pages.
International Search Report and Written Opinion for PCT Application No. PCT/US2016/038568, dated Oct. 11, 2016, 13 pages.
International Search Report and Written Opinion dated Mar. 15, 2017 for PCT Application No. PCT/US2016/064946, 9 pages.
Matijasevic, G., "Multilayer Circuitry on Metal Substrates," Electronics Cooling Magazine, Sep. 1, 2000, 9 pages.
Microcontact Printing, http://en.wikipedia.org/w/index.php?title=Microcontact_printing, retrieved on Aug. 5, 2014, 7 pages.
Orlovskaya et al., "Robust Design and Manufacturing of Ceramic Laminates with Controlled Thermal Residual Stresses for Enhanced Toughness," Journal of Materials Science, vol. 40, Issue 20, Oct. 2005, pp. 5483-5490.
Schwartz, E, "Roll to Roll Processing for Flexible Electronics," Cornell University, pp. 1-24, May 11, 2006.
Wright, S.L. et al., "Characterization of Micro-bump C4 Interconnects for Si-Carrier SOP Applications," Electronic Components and Technology Conference, 2006, pp. 633-640.

\* cited by examiner

INTERCONNECTION SUBSTRATES FOR INTERCONNECTION BETWEEN CIRCUIT MODULES, AND METHODS OF MANUFACTURE

CROSS REFERENCE TO RELATED APPLICATIONS

This continuation application claims the benefit of priority to U.S. patent application Ser. No. 15/403,679, filed on Jan. 11, 2017, now U.S. Pat. No. 10,014,243, issued on Jul. 3, 2018, which is a divisional application of U.S. patent application Ser. No. 14/533,728, filed on Nov. 5, 2014, now U.S. Pat. No. 9,583,426, issued on Feb. 28, 2017, each of which are incorporated herein by reference in their entirety.

BACKGROUND OF THE INVENTION

The present disclosure relates to electronic technology, and more particularly to substrates used to connect semiconductor integrated circuits to each other and to other circuits.

Integrated circuits (ICs) have tiny, closely-positioned contact pads that are difficult to connect to other circuits because the contact pads can be shorted to each other (by solder for example), can be misaligned with the other circuits due to warpage of circuit structures, and can be broken off from the other circuits by stresses arising from thermal expansion.

The ICs and other circuits can be interconnected through a common substrate such as a multi-layer ceramic interposer 110 (FIG. 1A) of the kind described in U.S. Pat. No. 7,833,370 issued to Kawamura et al. on Nov. 16, 2010. In FIG. 1A, ICs 120 have contact pads 120C attached to contact pads 110C of interposer 110 by connections 124 which may be solder, adhesive, or some other type. Interposer 110 includes conductive lines that interconnect the contact pads 110C in a desired pattern. The conductive lines include horizontal conductive lines 110LH and vertical conductive vias 110LV. In this example, interposer 110 has contact pads 110C both on top and bottom; the bottom contact pads can be connected to another substrate such as a printed circuit board (PCB) 114, by connections such as 124'. We call substrate 110 an "interposer" because it has contact pads both on top and bottom. In the past, the term "interposer" was used if contact pads 110C were differently spaced on top than the bottom: the top contact pads 110C can be closely-spaced to match the ICs' miniature spacings between pads 120C, while the bottom contact pads 110C can be farther apart to match coarser fabrication technology such as used for PCBs. However, in more recent use, the term "interposer" can denote any substrate used to interconnect other circuits and having contact pads both on top and bottom.

The interposer 110 of FIG. 1A has two layers 110.1, 110.2. FIG. 1B is an exploded perspective view of the two layers, and FIG. 1A shows a cut-away view obtained by cutting away the front part of the interposer by a vertical plane A-A (parallel to the XZ plane of an orthogonal XYZ coordinate system). The interposer is shown in a horizontal position, i.e. extending along a horizontal XY plane. Each layer 110.*i* (110.1, 110.2) includes a ceramic sheet 110S extending horizontally. In each layer 110.*i*, the horizontal lines 110LH are on top of the ceramic sheet, and vertical vias 110LV pass through the ceramic sheet to connect the horizontal lines 110LH to underlying features. The vertical vias 110LV are formed by punching holes in the "green" ceramic (i.e. before the ceramic is fired) and filling the holes with a conductive paste.

SUMMARY

This section summarizes some features of the invention. Other features may be described in the subsequent sections.

Some embodiments provide multi-layer interposers and other structures with novel arrangement of layers. Some embodiments are described below. The invention is defined by the appended claims.

DESCRIPTION OF SOME EMBODIMENTS

The embodiments described in this section illustrate but do not limit the invention. The invention is defined by the appended claims.

One aspect of the present invention relates to the layout of conductive lines in an interposer or other substrate used to interconnect ICs and other circuits. More particularly, in addition to vertical vias such as 110LV in FIG. 1A, some embodiments of the present disclosure include diagonal lines (non-vertical lines extending downward) and other shapes and features that can be formed on ceramic and non-ceramic substrates. FIG. 2 shows exemplary features 110L for a two-layer interposer. The interposer is shown as extending horizontally to facilitate comparison with FIG. 1A; FIG. 2 a cut-away view obtained using a vertical sectional plane like in FIG. 1A. Of note, in FIG. 2, layers 110.1 and 110.2 are arranged differently than in FIG. 1A: the layers of FIG. 1A extend horizontally and are stacked on top of one another; but the layers of FIG. 2 are stacked one in front of the other (layer 110.2 is in front of 110.1). This architecture facilitates fabrication of conductive lines and other features on the vertical surfaces of substrates 110S. The interposer of the type of FIG. 2 may have vertical conductive lines (vias) such as 110L.10, and the lines may extend through the entire height (Z-dimension) of the two-layer interposer. In addition, the interposer may have diagonal conductive lines such as 110L.1, also possibly extending the full height; diagonal lines may provide shorter conductive paths than the lines made of vertical and horizontal segments, so as to achieve high speed or low power consumption, to provide more interconnect routes, or for other purposes. Features 110L may include capacitors (note capacitor plate 110L.2), resistors, inductors, diodes, transistors, and other circuit elements. Features 110L may include a multi-level redistribution layer (RDL, not shown in FIG. 2) with multiple levels of conductive features separated by dielectric layers. Features 110L may include non-conductive elements, e.g. non-conductive semiconductor features for transistors, diodes, etc. Features 110L may also include non-circuit elements, e.g. heat spreaders made of highly thermally conductive materials (possibly metal or other materials, possibly more thermally conductive than the adjacent substrates 110S); such heat spreaders conduct heat from inside of the interposer to the interposer's boundary. For example, feature 110L.10 could be a heat spreader which is not part of any circuit.

Figure 3:
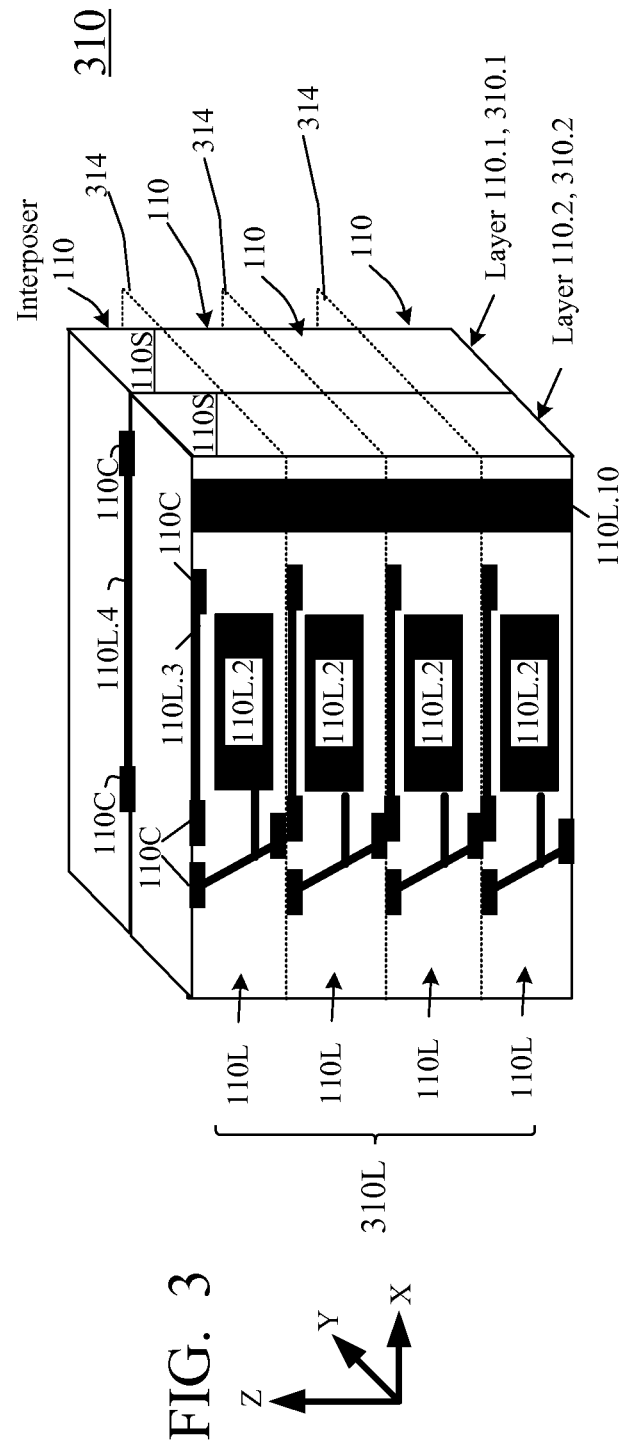
FIG. 3 is a perspective cut-away view of a structure that can be separated into multiple multi-layer substrates each of which provides an interposer, or can be augmented to provide an interposer, according to some embodiments of the present invention.

Some embodiments provide novel manufacturing methods to facilitate fabrication of such features, possibly in batch (i.e. simultaneously for multiple interposers). Thus, in some embodiments, multiple interposers such as 110 are fabricated as part of a single structure 310 (FIG. 3). In the example of FIG. 3, the structure will provide four interposes 110 when diced along the horizontal planes 314. Like each interposer 110, structure 310 is a two-layer structure, with layers 310.1, 310.2 extending vertically. Layer 310.1 will provide the layers 110.1 of all the interposers, and layer 310.2 will provide the layers 110.2 of all the interposers. More than two layers can be present.

Figure 4A:
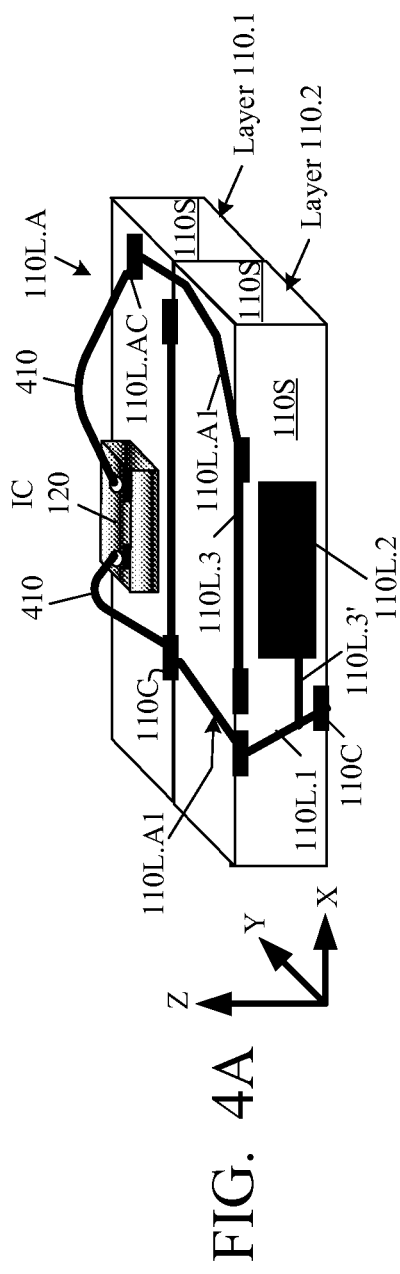
FIGS. 4A and 4B are perspective cut-away views of integrated circuits attached to interposers according to some embodiments of the present invention.
Figure 4B:
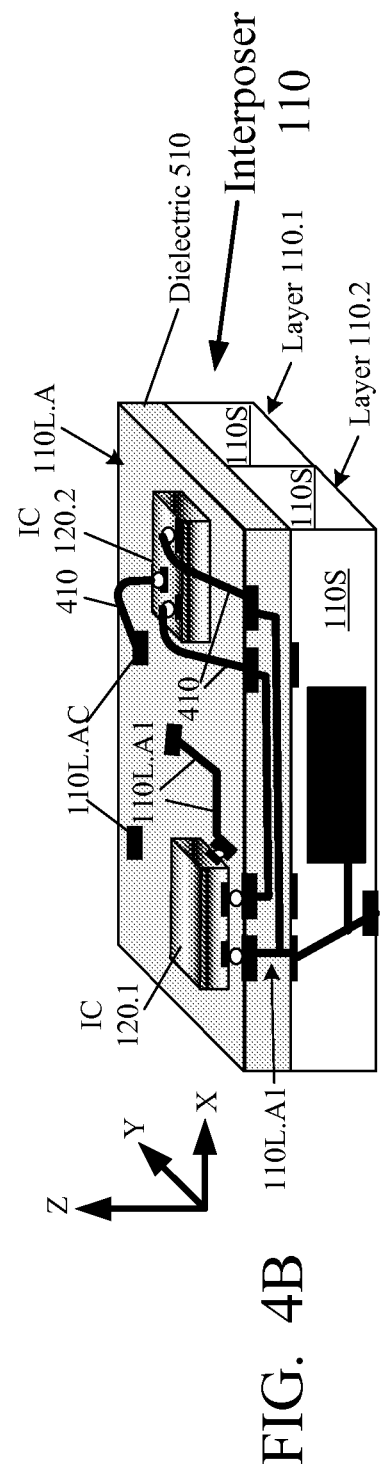

Each layer 310.i (310.1, 310.2) includes features 310L which provide the features 110L for the corresponding interposer layers 110.i. The features 310L are formed on large vertical surfaces of layers 310.i, so these features are not limited to vertical vias as in FIG. 1A. Such features may include horizontal lines (such as 110L.3 and 110L.3' in FIG. 2), and may include vertical and diagonal lines and other features as explained above. Additional horizontal features can be fabricated after the interposer singulation (i.e. after dicing along the planes 314) on the large top and bottom interposer surfaces. For the interposer of FIG. 2, features formed after singulation on top of the interposer are shown as 110L.A in the examples of FIGS. 4A and 4B. These features may include conductive lines (such as 110L.A1), contact pads (such as 110L.AC), and may include resistors, transistors, capacitors, inductors, and other features. These features may extend over multiple layers 110.i in any direction; for example, a conductive line or a contact pad may extend over multiple layers. Multiple levels of such features can be provided, separated by dielectric 510 (FIG. 4B). Similar features can be provided on the interposers' bottom surfaces.

These interposers can be used in any desired manner. In FIG. 4A, an IC 120 is attached to the interposer's top surface with contact pads facing up; the IC's contact pads are connected to the interposer's contact pads 110C and/or 110L.AC by discrete wires 410. In FIG. 4B, IC 120.2 is similarly connected; IC 120.1 is attached to the top surface in a flip-chip manner, with contact pads on the bottom that are attached to contact pads 110L.AC (as in FIG. 1A). IC 120.1 may have additional contact pads on top (not shown) attached with wires to the interposer's contact pads. The interposer can be used in other assemblies as known in the art.

Figure 1A:
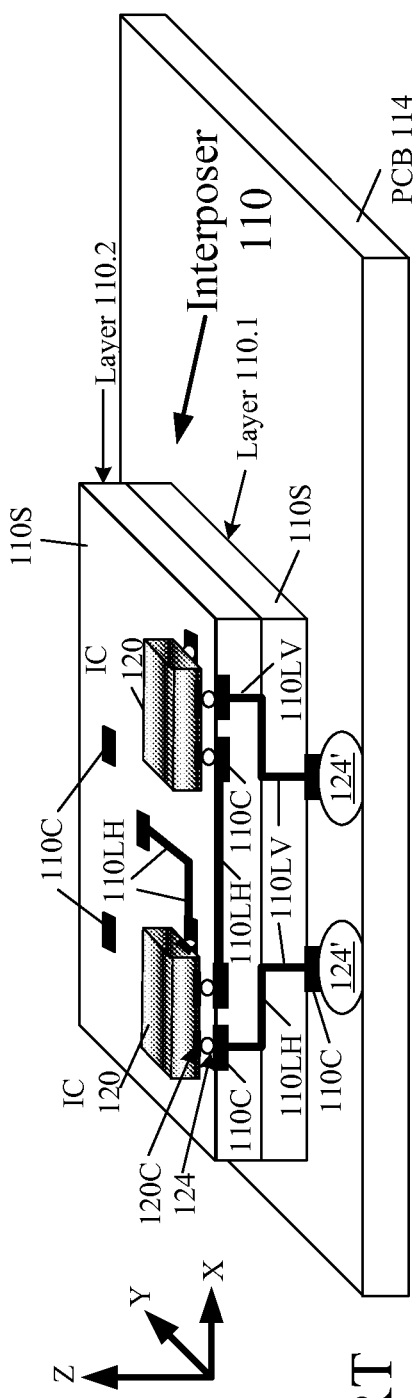
FIG. 1A is a perspective cut-away view of integrated circuits attached to an interposer according to prior art.
Figure 1B:
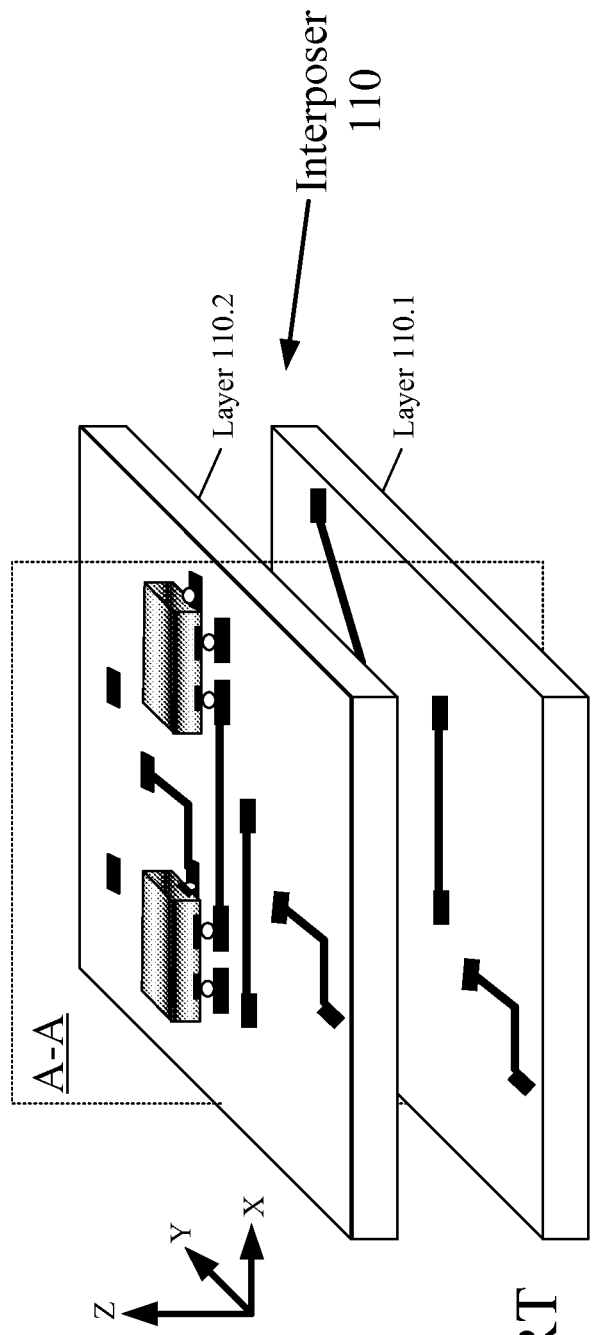
FIG. 1B is an exploded perspective view of the structure of FIG. 1A.
Figure 2:
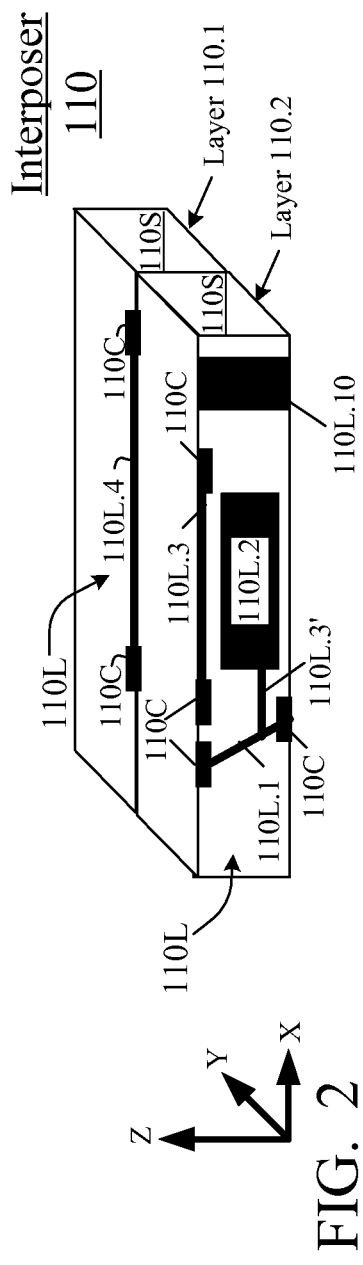
FIG. 2 is a perspective cut-away view of a multi-layer substrate which provides an interposer, or can be augmented to provide an interposer, according to some embodiments of the present invention.

Still other features 110L can be provided by conductive vias (not shown in FIGS. 2-4; shown at 110L.100 in FIG. 5B discussed below) made in possibly horizontal holes through substrates 110S of layers 110.i; such vias can be formed before singulation by the same process as vias 110LV in FIG. 1A if the substrates 110S are ceramic, or by other processes. For example, if a substrate 110S is silicon or glass, the vias can be formed by TSV (through-substrate-via) technology; see e.g. U.S. pre-grant patent publication no. 2014/0175654 (Haba et al., Jun. 26, 2014) incorporated herein by reference.

As noted above, FIGS. 2, 3, 4A, 4B are cut-away views: features 110L and 310L of layers 110.2 and 310.2 are shown as exposed; but in the complete structure, these features can be covered by a protective layer (e.g. dielectric, possibly polyimide or other type). This is not limiting however: in some embodiments the features 110L, 310L are exposed in the final structure.

As is known, an interposer may have to be thin to provide shorter conductive paths between circuits below and above the interposer (e.g. between ICs 120 and PCB 114 in FIG. 1A). The interposers of FIGS. 2 and 3 can be made thin simply by reducing the distance between the dicing planes 314. The layers 110.i, 310.i can be thick because their thickness does not contribute to the interposer thickness (the thickness of layers 110.i, 310.i relates to the interposer's horizontal dimensions). Allowing greater thickness of each layer leads to relaxed manufacturing tolerances. For example, for a given horizontal area, one can provide more thinner layers or fewer thicker layers as needed to manufacture desired circuitry.

In FIG. 3, all the interposers 110 are identical, but in other embodiments non-identical interposers 110 may be formed in the same structure 310; e.g. the interposers may have different circuitry 110L and/or different heights. Also, the planes 314 do not have to be horizontal. Of note, the terms "horizontal" and "vertical" are used to simplify the description, but the interposers or other structures can be at any angle and any orientation. Some embodiments include non-interposer substrates, i.e. substrates with contact pads only on one side, or possibly other types of substrates.

Figure 5A:
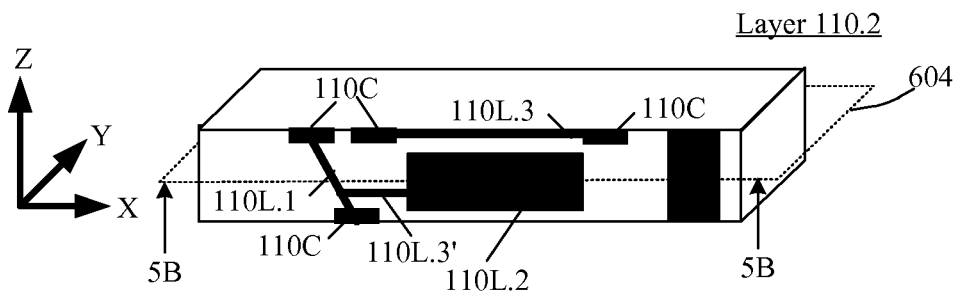
FIG. 5A is a perspective cut-away view of one layer of a multi-layer substrate which provides an interposer, or can be augmented to provide an interposer, according to some embodiments of the present invention.
Figure 5B:
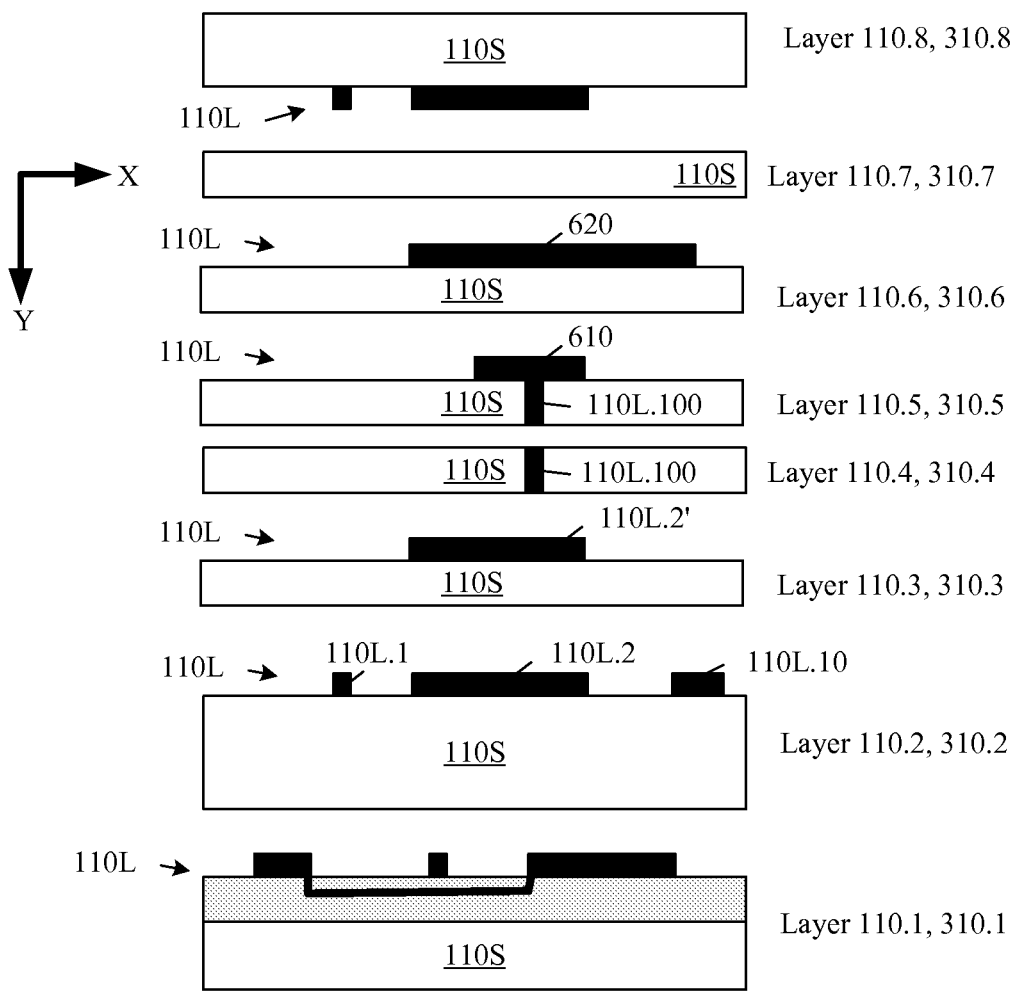
FIG. 5B is an exploded cross-sectional view a multi-layer substrate which provides an interposer, or can be augmented to provide an interposer, according to some embodiments of the present invention.

FIGS. 5A, 5B illustrate an eight-layer interposer, with layers 110.1 to 110.8. Layer 110.2 is the same as in FIG. 2, and is reproduced in FIG. 5A. FIG. 5B is an exploded cross-sectional view of layers 110.1 to 110.8 as seen in the horizontal cross section by plane 604 of FIG. 5A (plane 604 is parallel to the XY plane). FIG. 5B is the bottom view of this cross section. Further, the same view pertains to a structure 310 from which the interposer is made. Indeed, as seen in FIG. 3, if a structure 310 is cut by a horizontal sectional plane through an interposer 110, then this plane will pass only through that interposer 110 and no other interposer, so the sectional view of the structure 310 is the same as the sectional view of the interposer. Therefore, FIG. 5B is a sectional view of both the interposer 110 and the corresponding structure 310.

In FIG. 5B, each layer 110.i includes a substrate 110S made of ceramic or some other material. In layer 110.1, features 110L include a multi-level structure on substrate 110S of the kind described above (i.e. multiple levels of circuit elements separated by dielectric).

Layer 110.2 includes capacitor plate 110L.2 as in FIG. 2. The capacitor's other plate 110L.2' is located on substrate 110S of overlying layer 110.3. Substrate 110S of layer 110.3 provides capacitor dielectric.

Layer 110.4 has no features 110L other than a conductive via 110L.100 going through the substrate. This via, together with a similar via 110L.100 in layer 110.5, connects the capacitor plate 110L.2' to a feature 610 in layer 110.5. Layer 110.4 could be omitted, or could be used for adhesion and/or barrier layer properties of its substrate 110S.

Via 110L.100 in substrate 110.5 can be made be any suitable process, e.g. as a TSV.

In layer 110.5, feature 610 is a MOS transistor gate. The transistor's source/channel/drain region 620 is a feature 110L of layer 110.6; the gate dielectric is provided by substrate 110S of layer 110.6. The transistor regions 610, 620 can be connected to contact pads 110C (such as in FIG. 2 or 4) and/or other elements by lines or other features 110L (not shown) that are not in the cross-sectional plane of FIG. 5B.

Layer 110.7 has no features 110L, and can be an adhesive or barrier layer as described above for layer 110.4. Layer 110.8 has features 110L on the bottom of substrate 110S. In other embodiments, layer 110.8 has no features 110L; layers 110.8 and 110.7 serve as protective layers for the interposer.

The invention is not limited to the structure of FIG. 5B; for the example, an interposer may have any number of layers, possibly thousands of layers. Also, other types of features 110L can be present.

Substrates 110S of different layers can be made of the same or different materials. Examples include partially cured (B-stage) epoxy, molding compounds, polyimide, ceramic, glass, etc., possibly thermally conductive matrix materials with additives. For example, in some embodiments, all substrates 110S are ceramic; structure 310 can be fabricated by methods described in the aforementioned U.S. Pat. No. 7,833,370 incorporated herein by reference. Exemplary ceramic materials for substrates 110S include glass, alumina, zinc oxide, and others, possibly including or consisting of a ceramic matrix with fibers or other particles; appropriate materials are also described in the aforementioned U.S. Pat. No. 7,833,370. The ceramic substrates can be manufactured by known techniques, e.g. glass powder spraying. Substrates 110S can be made of a green ceramic tape, such as available for example from Murata Manufacturing Company, Ltd. of Japan or DuPont of USA. Advantageously, some ceramic tapes have low shrinkage, possibly below 10%. Substrates 110S of different layers 310.i may have the same or different thicknesses; an exemplary ceramic substrate's thickness is 100 to 200 microns, and such substrates 110S can be used to provide thousands of layers in a single interposer; other thickness values are possible, and a thickness can vary throughout the same layer 110.i. Non-ceramic materials are also possible as noted above.

In each layer 310.i, the features 310L can be made by known techniques, e.g. deposition (e.g. electroplating or other type), photolithographic patterning, etching or laser oblation, and others. Vias 110L.100 can be formed as in the aforementioned U.S. Pat. No. 7,833,370 (punching holes in ceramic sheets), or by TSV technology for substrates 110S made of silicon, glass, or some other materials. Metal features can be deposited by printing—some printing technologies are simple and low cost. Suitable printing technologies include rotogravure, roll-to-roll printing (including possibly R2R nanoimprint), stencil printing, laser assisted forward printing, nanotrasfer printing, microcontact printing. Semiconductor features such as 620 and other features can be formed from organic or inorganic semiconductor materials, possibly by lamination—see U.S. Pre-Grant Patent Publication 2007/0004229 (Malajovich, Jan. 4, 2007). The invention is not limited to these particulars.

In some embodiments, structure 310 is fabricated layer by layer as follows. Substrate 110S of bottom layer 310.1 is stacked on an earlier fired ceramic substrate (not shown; see the aforementioned U.S. Pat. No. 7,833,370). Then the features 310L of layer 310.1 are printed or otherwise formed. Then the next substrate 110S (of layer 310.2) is stacked on layer 310.1. Then features 310L of layer 310.2 are formed; and so on until the last layer. If the substrates 110S are ceramic, all the substrates can be fired after the stack 310 is complete, or alternatively the structure can be fired at intermediate stages, before completion of the stack. Low temperature firing (at below 1000° C.) is used in some embodiments, but high temperatures are used in others. In some embodiments, one or more bottom layers are ceramic but one or more top layers are non-ceramic, and the structure is fired after stacking all the ceramic layers but before stacking the non-ceramic layers.

Alternatively, for one or more layers 310.i, the features 310L can be formed before the layer is placed on the underlying layer or substrate. Features 310L can be formed on the top and bottom surfaces of a substrate. Also, in ceramic embodiments, a layer 310.i can be fired before it is placed on the underlying layer or substrate.

Figure 6A:
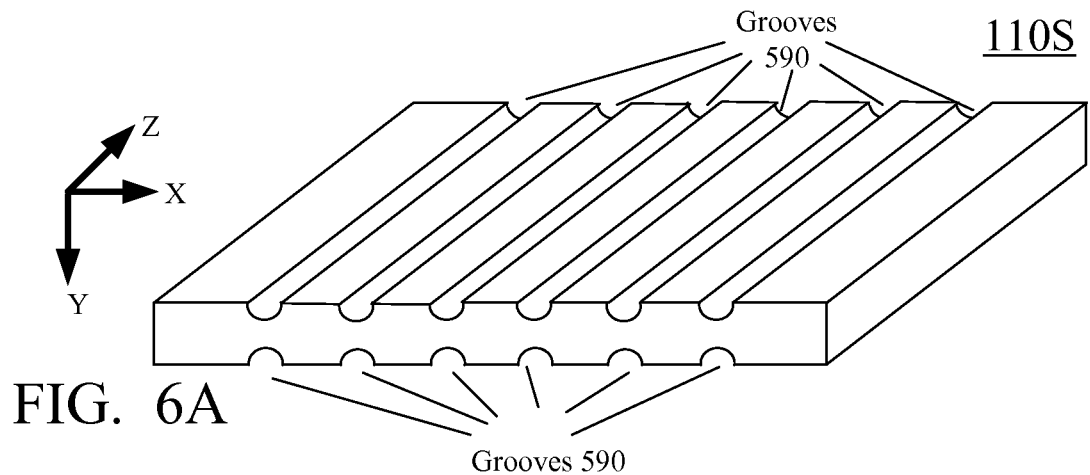
FIG. 6A is a perspective view of a substrate for one layer of a structure that can be separated into multiple multi-layer substrates each of which provides an interposer, or can be augmented to provide an interposer, according to some embodiments of the present invention.

FIG. 6A illustrates a substrate 110S of a layer 310.i in which at least some of features 310L will be formed before the layer is placed on the underlying layer or substrate. The features 310L will be formed in the top and bottom grooves 590 in substrate 110S. The substrate is shown in a perspective view, with the front surface being in the XY plane (this plane is shown as horizontal in FIG. 3, so the layer of FIG. 6A is turned by 90° to extend horizontally rather than vertically; in both FIGS. 3 and 6A, each layer 310.i extends along the XZ plane). Any suitable material can be used for substrate 110S, including moldable materials. Examples include partially cured (B-stage) epoxy, molding compounds, polyimide, ceramic, glass, etc. In some embodiments, the entire substrate with the grooves is formed by molding. Other materials and fabrication methods can also be used; grooves 590 can be formed by a masked etch for example.

Conductive lines or other features 310L (FIG. 6B) are formed in the grooves by any suitable method, e.g. stencil printing or electroless plating. Suitable materials include solder (e.g. solder paste with copper) and possibly other sinterable materials. If desired, photolithographic masking can be used to form the features 310L by plating, sputtering, or other deposition-and-etch methods involving either deposition of material 310L over the entire substrate 110S and then masked removal of the material 310L outside the trenches or including lift-off patterning. Lines 310L can be formed from multiple materials, e.g. a layer of copper and a subsequently deposited layer of solder.

Figure 6B:
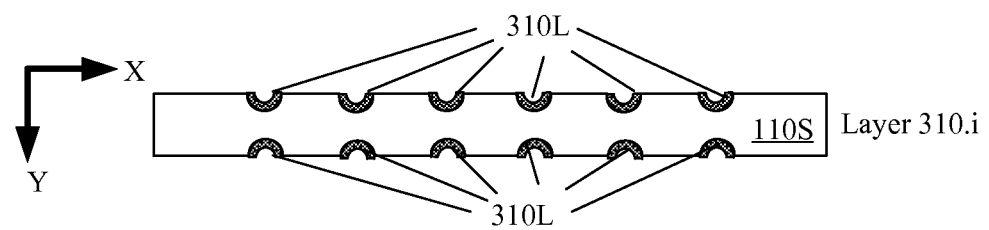
FIG. 6B is a side view of the layer of FIG. 8A in the process of fabrication according to some embodiments of the present invention.
Figure 6C:
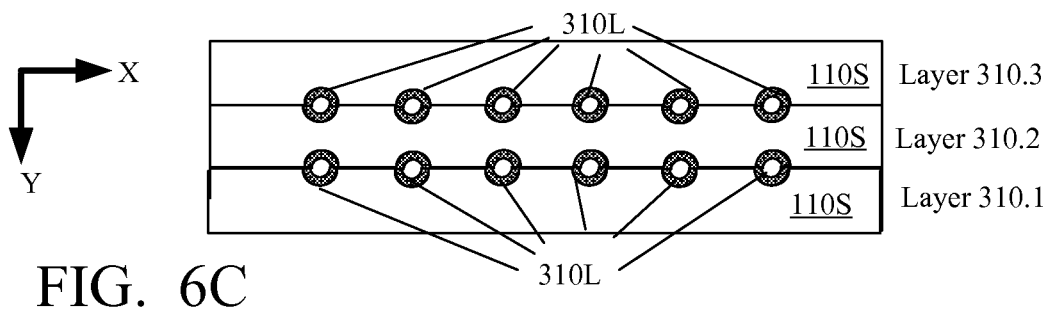
FIGS. 6C and 7 are side views of structures that can be separated into multiple multi-layer substrates each of which provides an interposer, or can be augmented to provide an interposer, according to some embodiments of the present invention.

FIG. 6C illustrates three layers 310.1, 310.2, 310.3 processed as in FIGS. 6A, 6B and bonded together. In this embodiment, in the top and bottom layers 310.1 and 310.3, the grooves and the lines 310L are formed on one side only, facing the layer 310.2. When the three layers are brought together, their grooves match, i.e. each groove in one of the layers faces a groove in the adjacent layer, and the respective lines 310L physically contact each other. Thus, each line 310L in layer 310.2 physically contacts a line 310L in layer 310.1 or 310.2, possibly along the entire length of the line. Consequently, the three layers can be bonded by bonding their matching lines 310L (e.g. by solder reflow if the lines 310L have solder surfaces, or by thermocompression, or conductive adhesive deposited into the grooves 590 over the lines 310L, or possibly by other types of bonding). Alternatively or in addition, the layers can be bonded by bonding together their substrates 110S if the substrates physically contact each other between the grooves 590. This bonding can use any suitable methods, e.g. direct bonding or dielectric adhesive.

The structure 310 can be diced by known techniques along the planes such as 314, i.e. parallel to the XY plane. The ends of lines 310L may provide contact pads 110C or they may be connected to the contact pads by lines 110L.A as described above in connection with FIGS. 4A and 4B.

Figure 7:
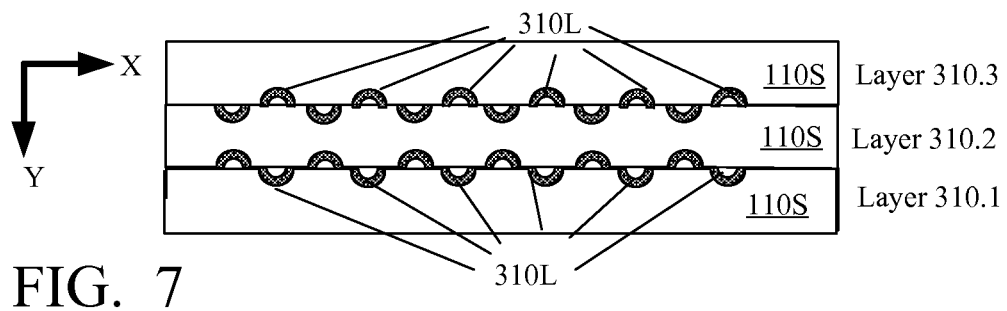

FIG. 7 shows another embodiment in which the grooves 590 and the lines 310L of adjacent substrates do not match; each line 310L of each substrate can be electrically insulated from all the other lines 310L in the three layers. The grooves and lines may have any geometry, and any number of layers can be present and can be combined with other types of layers (e.g. without the grooves 590) described above. The grooves may contain other features, possibly multiple layers of features, e.g. transistor source/drain/channel regions or entire transistors.

Figure 8A:
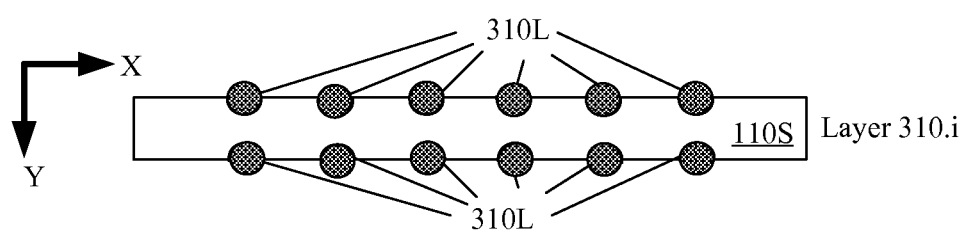
FIG. 8A is a side view of a layer of a structure that can be separated into multiple multi-layer substrates each of which provides an interposer, or can be augmented to provide an interposer according to some embodiments of the present invention.
Figure 8B:
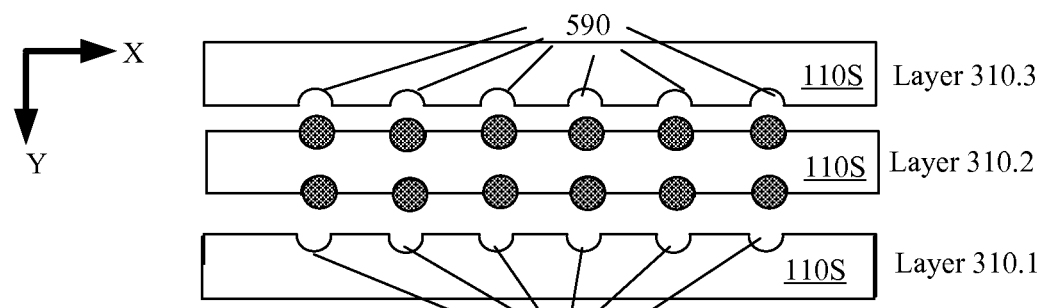
FIG. 8B is a side view of a structure that can be separated into multiple multi-layer substrates each of which provides an interposer, or can be augmented to provide an interposer, according to some embodiments of the present invention.

FIG. 8A is similar to FIG. 6B, but the lines 310L protrude out of the grooves, not just cover the grooves' surfaces as in FIG. 6B. In some embodiments (FIG. 8B), the grooves of adjacent layers match each other as in FIG. 6C, but the lines 310L are formed only on the middle layer 310.2; since the lines protrude out of the grooves of layer 310.2, the lines fill the grooves in layers 310.1, 310.3 partially or completely when the three layers are joined together (FIG. 8B). Thicker lines are advantageous for reducing the electrical and thermal resistances, but making the lines in only one layer may simplify fabrication. In some embodiments, the lines 310L are formed in layer 310.1 and at the top, but not the bottom, of layer 310.2; layer 310.3 does not have lines 310L (like in FIG. 8B).

The structures of FIGS. 6A through 8B can be augmented with a dielectric layer (not shown) separating the lines 310L from the substrates 110S if the substrates are not dielectric. Other layers, e.g. compliant layers such as polyimide, may be formed on the groove sidewalls to reduce thermal stresses.

Structure 310 can be diced by the technique described in the aforementioned U.S. Pat. No. 7,833,370 or by other techniques.

In some embodiments (such as described above), each substrate 110S is solid before and after its stacking on an underlying substrate or layer. Alternatively, one or more (possibly all) substrates 110S can be made of a non-solid material, e.g. from a flowable material (semisolid and/or liquid), and/or from vapor phase. In some embodiments, a flowable material is deposited on the underlying layer or substrate by blade casting or molding or some other method, and then cured to solid phase. Exemplary flowable materials include polyimide and epoxy. Suitable flowable epoxy-based materials include photoresist (such as SU-8) and molding compounds.

As noted above, one or more (possibly all) substrates 110S can be formed from a vapor phase, e.g. by chemical vapor deposition (CVD) on the underlying substrate or layer. Physical vapor deposition (CVD) and other methods can be used to form a substrate 110S directly on the underlying substrate or layer.

A substrate 110 may include layers of different materials; for example a substrate may have a semiconductor layer (possibly silicon) coated with dielectric on top and/or bottom and/or sides.

In some embodiments, the interfaces between adjacent substrates 110S are sharply defined, but interfaces can also blur or disappear due to interdiffusion of the substrates' materials.

Interposer 110 can have any suitable dimensions. In illustrative embodiments, the interposer thickness (the Z dimension in FIG. 2) is 10 to 1000 microns, and each of the X and Y dimensions is 10 to 100 mm. Other dimensions are also possible. The invention includes interposers having a thickness greater than the horizontal dimensions (i.e. the Z dimension can be greater than the X and Y dimension). Also, an interposer can be cubic (i.e. equal dimensions are possible).

Figure 9A:
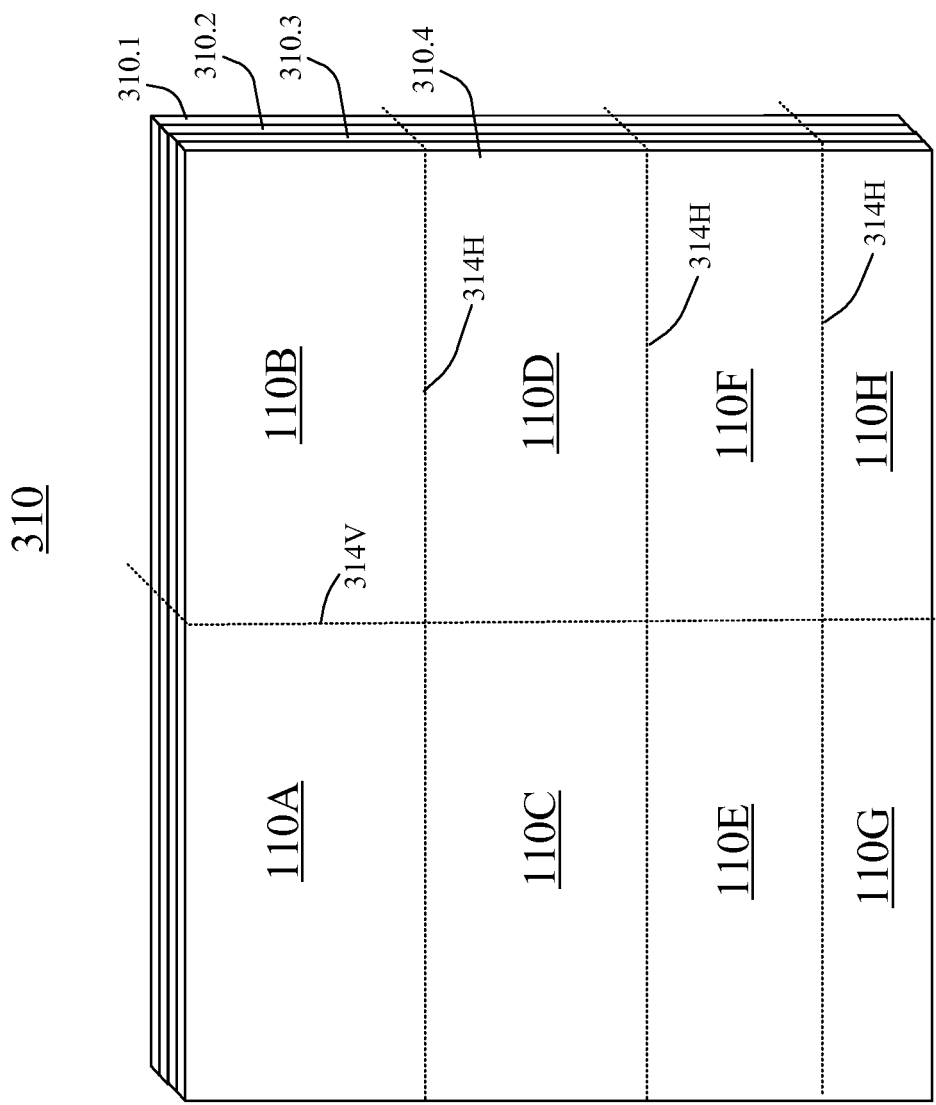
FIG. 9A is a perspective view of a structure that can be separated into multiple multi-layer substrates each of which provides an interposer, or can be augmented to provide an interposer, according to some embodiments of the present invention.
Figure 9B:
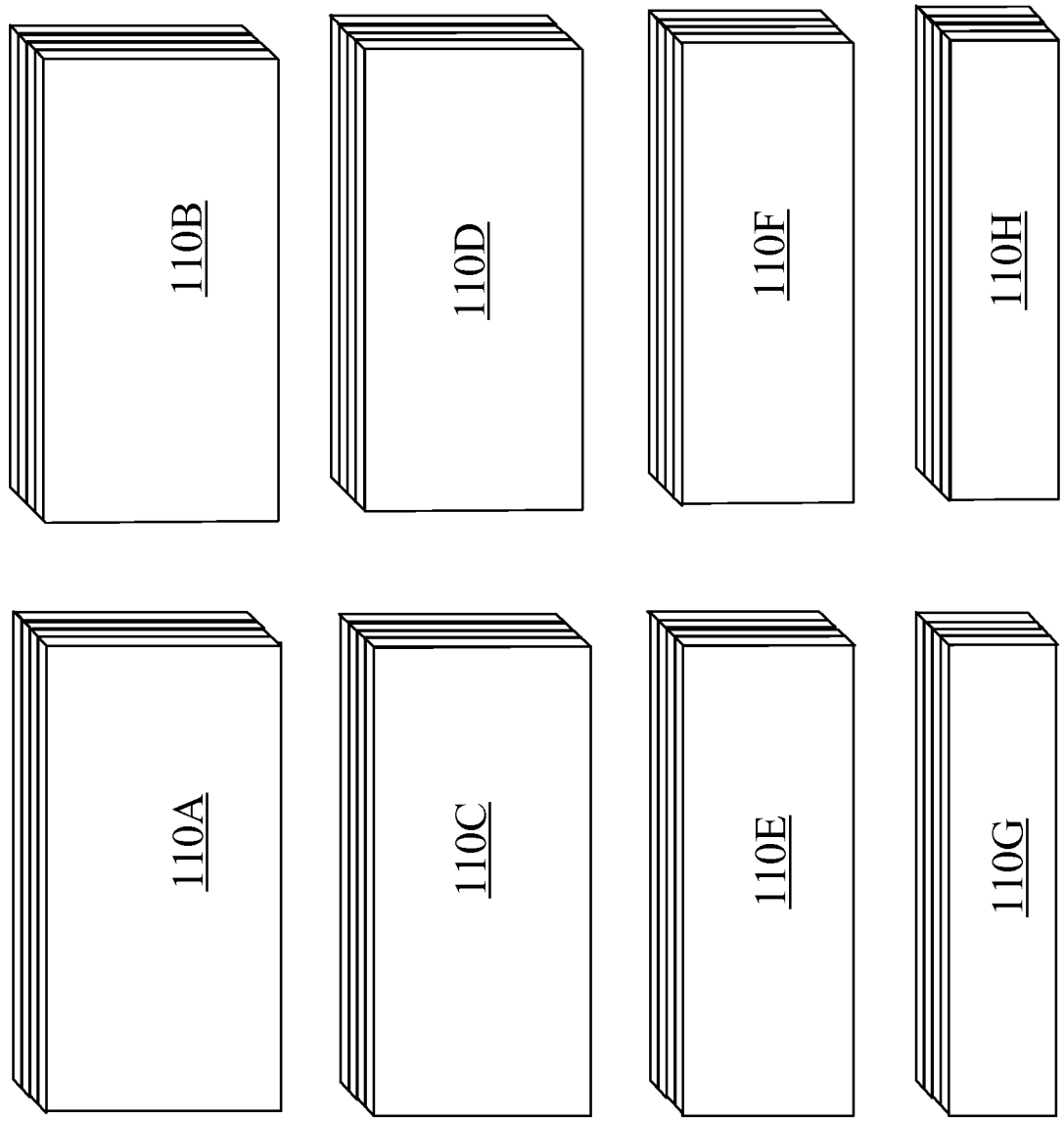
FIG. 9B is a perspective view of the multi-layer substrates obtained from the structure of FIG. 9A.

Interposers 110 and structures 310 can be of any shapes and sizes. See FIGS. 9A, 9B illustrating a structure 310 (FIG. 9A) divided into eight interposers 110A to 110H (FIG. 9B) by horizontal planes 314H and a vertical plane 314V. Plane 314V is parallel to the YZ plane and perpendicular to the interposers' major surfaces which are parallel to the XZ plane, but the sectional planes 314 do not have to be horizontal or vertical.

Figure 10:
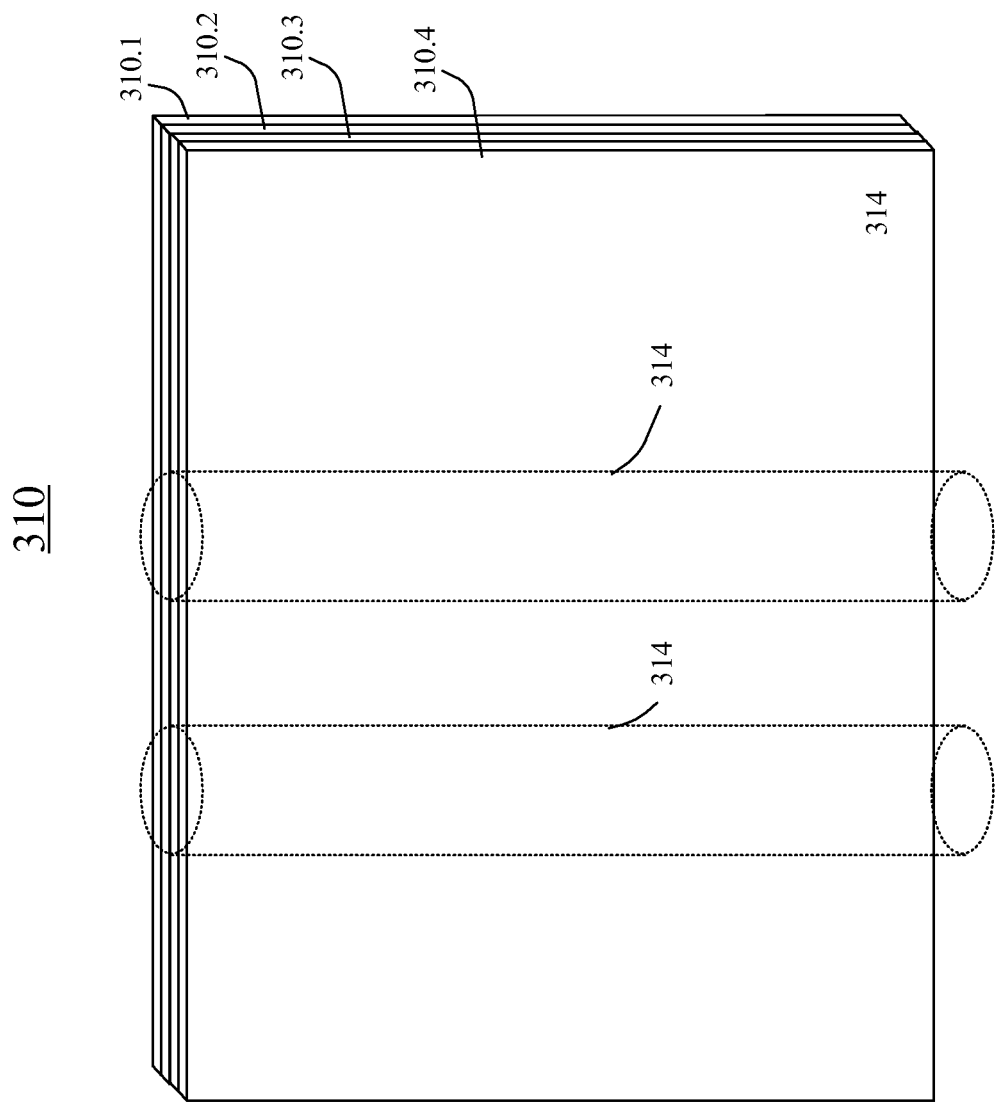
FIG. 10 is a perspective view of a structure that can be separated into multiple multi-layer substrates each of which provides an interposer, or can be augmented to provide an interposer, according to some embodiments of the present invention.

In FIG. 10, the structure 310 is singulated along non-planar (e.g. cylindrical) sectional surfaces 314.

Some embodiments of the present invention are defined by the following clauses.

Clause 1 defines a manufacture comprising a member (possibly an interposer) operable to function at least as an interconnection substrate providing interconnection between circuit modules if they are connected to the interconnection substrate. Examples of circuit modules are die 120 and packaging substrates. In some embodiments, the member may also provide other, non-interconnection functions via the member's circuitry.

Further, according to clause 1, the member comprises a plurality of contact pads for connection to the circuit modules, and comprises interconnection circuitry (e.g. 110L) providing interconnection between the contact pads;

wherein the contact pads comprise one or more first contact pads located at a top surface of the member. Of note, the member can be operated at any angle, so the "top surface" is just some surface for ease of reference below. For example, the top surface can be either the top or bottom surface in FIG. 2, 3, 9B or 10.

Further, according to clause 1, the member comprises a multi-layer substrate (e.g. a substrate obtained by dicing the structure 310) comprising a plurality of first layers (e.g. 110.i) arranged in sequence one after another, each first layer being transverse (possibly but not necessarily perpendicular) to the member's top surface, the first layers comprising at least a part of the interconnection circuitry.

Clause 2 defines the manufacture of clause 1 wherein at least one first contact pad is part of at least one first layer. For example, in FIG. 2, contact pads 110C are part of layer 110.i.

Clause 3 defined the manufacture of clause 1 wherein the member comprises a dielectric (e.g. 510 in FIG. 4B) overlying the multi-layer substrate, wherein at least one first contact pad overlies the dielectric.

Clause 4 defines the manufacture of any preceding clause wherein the interconnection circuitry comprises a continuous non-dielectric feature overlying two or more first layers. See for example features 110L.A1 in FIG. 4A.

Clause 5 defines the manufacture of any preceding clause wherein the member's top surface comprises an area for attachment of at least one circuit module which is for connection to at least one first contact pad.

Clause 6 defines the manufacture of any preceding clause further comprising a first circuit module having circuitry connected to a first contact pad.

Clause 7 defines the manufacture of clause 6 wherein the first circuit module is attached to the member's top surface.

Clause 8 defines the manufacture of any preceding clause wherein the first layers comprise at least one pair of adjacent first layers, the pair of adjacent first layers comprising circuitry at least partially present at an interface of the first layers of the pair and electrically connected to at least one first contact pad, wherein each first layer in the pair comprises a support substrate (e.g. 110S) for supporting the circuitry.

Clause 9 defines the manufacture of clause 8 wherein the interface extends through the multi-layer substrate to divide the multi-layer substrate into two parts each of which comprises one and only one first layer of the pair.

Clause 10 defines the manufacture of clause 8 wherein at least two of the support substrates each comprise ceramic material.

Clause 11 defines a manufacture comprising a member operable to function at least as an interconnection substrate providing interconnection between circuit modules if they are connected to the interconnection substrate, the member comprising a top surface extending generally along a first plane (e.g. XY plane), the member comprising a plurality of contact pads for connection to the circuit modules, the contact pads comprising one or more first contact pads located at the top surface;

wherein the member comprises a support structure (e.g. made of substrates 110S) supporting the member's circuitry, the member comprising a conductive line (e.g. 110L.1 in FIG. 4A) extending through the support structure between top and bottom surfaces of the support structure, wherein at least a segment of the conductive line is not perpendicular to the first plane. For example, line 110L.1 is not perpendicular to the XY plane.

Clause 12 defines the manufacture of clause 11 wherein the conductive line has no segment perpendicular to the first plane.

Clause 13 defines the manufacture of clause 11 or 12 wherein the conductive line extends generally along a second plane perpendicular to the first plane. For example, in FIG. 4A, line 110L.1 extends generally along the XZ plane which is perpendicular to the XY plane.

Clause 14 defines a method for fabricating one or more first multi-layer substrates for respective one or more members each of which is operable to function at least as an interconnection substrate for providing interconnections between circuit modules, each member comprising a plurality of contact pads for connection to the circuit modules. For example, each module can be an interposer. A structure 310 may provide a number of modules, but may also provide just one module; the remaining pieces obtained by the dicing of structure 310 may be discarded; in some embodiments, circuitry 310L is fabricated for just one interposer.

The method of clause 14 comprises:

forming a stack of first layers (e.g. structure 310) to provide a multi-layer structure, the multi-layer structure comprising circuitry;

separating the multi-layer structure into a plurality of multi-layer pieces at least one of which is a first multi-layer substrate which comprises a part of each first layer, the first layers' parts extending to a first side of the first multi-layer substrate, the multi-layer substrate comprising at least part of the circuitry which is accessible from the first side of the first multi-layer substrate. For example, in FIG. 2, 4A or 4B, the first side could be the top side; the circuitry 110L is accessible from the top surface.

Clause 15 defines method of clause 14 further comprising forming one or more conductive features (e.g. 110L.A) over the first side of the first multi-layer substrate, the one or more conductive features comprising one or more contact pads attachable to the circuit modules.

Clause 16 defines the method of clause 14 or 15 further comprising attaching one or more circuit modules to the first multi-layer substrate to provide access to said at least part of the circuitry from the one or more circuit modules.

Clause 17 defines the method of clause 14, 15, or 16 wherein attaching the one or more circuit modules comprises attaching at least one circuit module to the first side of the first multi-layer substrate.

Clause 18 defines the method of clause 14, 15, 16, or 17 further comprising attaching a plurality of circuit modules to the first multi-layer substrate to interconnect the one or more circuit modules through said at least part of the circuitry.

Clause 19 defines method of clause 14, 15, 16, 17, or 18 wherein at least one first layer comprises a ceramic substrate.

Clause 20 comprises the method of clause 14, 15, 16, 17, 18, or 19 wherein each first layer comprises a ceramic substrate.

The invention is not limited to the embodiments described above. Other embodiments and variations are within the scope of the invention, as defined by the appended claims.

The invention claimed is:

1. A structure providing interconnection between circuit modules, comprising:
   a top surface and a bottom surface of the structure;
   vertical layers of at least a dielectric material between the top surface and the bottom surface;
   one or more first contact pads located at the top surface for connection to one or more of the circuit modules, and one or more second contact pads located at the bottom surface for connection to one or more of the circuit modules;

interconnection circuitry providing interconnection between at least one of the first contact pads at the top surface and at least one of the second contact pads at the bottom surface, the interconnection circuitry disposed between the vertical layers or within an interface between the vertical layers;

the interconnection circuitry between the vertical layers comprising a multi-level electronic circuit including multiple levels of circuit elements separated at each level by the dielectric material of the vertical layers; and the interconnection circuitry including at least conductive lines or conductive features on opposing sides of one of the vertical layers, wherein the vertical layer provides a capacitor dielectric between the conductive lines or the conductive features to make at least one capacitor.

2. The structure of claim 1, wherein at least one of the vertical layers comprises a semiconductor layer coated with a dielectric on at least one side and a majority of the vertical layers comprise adjacent nonconductive substrate layers made of the dielectric material.

3. The structure of claim 1, wherein the vertical layers of at least the dielectric material comprise a material selected from the group consisting of a polyimide, an epoxy, a photoresist, and a molding compound.

4. The structure of claim 1, further comprising at least one transistor or at least one passive electronic component.

5. An interposer, comprising:

vertical layers of one or more substrates laminated together to provide a horizontal top surface and a horizontal bottom surface; and interconnection circuitry between the vertical layers comprising a multi-level electronic circuit including multiple levels of circuit elements separated at each level by the dielectric material of the vertical layers, the interconnection circuitry including conductive lines disposed between the vertical layers, each conductive line disposed between two adjacent vertical layers for making a conductive connection between two points on the horizontal top surface or between two points on the horizontal bottom surface or between a first point on the horizontal top surface and a second point on the horizontal bottom surface; the vertical layers and the conductive lines laminated together to make a single member; wherein at least some conductive lines on opposing sides of at least one of the vertical layers provides at least one capacitor through the at least one vertical layer.

6. The interposer of claim 5, wherein at least one of the vertical layers comprises a semiconductor coated with a dielectric on at least one side.

7. The interposer of claim 5, wherein each vertical layer has interconnection circuitry coplanar with the vertical layer, and coplanar faces of the vertical layers are direct bonded together into a laminated stack.

8. The interposer of claim 5, further comprising conductive lines disposed diagonally in a straight line between contact pads on the horizontal top surface and respective offset contact pads on the horizontal bottom surface, each contact pad on the horizontal bottom surface horizontally offset from a corresponding contact pad on the horizontal top surface by a respective horizontal offset distance.

9. The interposer of claim 5, wherein each conductive line is printed on one of the vertical layers.

10. The interposer of claim 5, wherein the multi-level electronic circuit includes at least one single electronic circuit disposed on multiple levels between multiple instances of the vertical layers.

11. The interposer of claim 5, wherein the multi-level electronic circuit comprises multiple transistors and multiple capacitors disposed on multiple levels between multiple instances of the vertical layers.

12. The structure of claim 1, further comprising at least one diagonal conductive line deposited on one of the vertical layers, the diagonal conductive line connecting one of the first contact pads on the top surface with one of the second contact pads on the bottom surface, the second contact pad on the bottom surface horizontally offset from the first contact pad on the top surface; and wherein the diagonal conductive line comprises a straight line between the first contact pad on the top surface and the offset second contact pad on the bottom surface.

13. The structure of claim 12, wherein the diagonal conductive line proceeds between the first contact pad on the top surface and the second contact pad on the bottom surface without a hole or a via in the structure for the diagonal conductive line.

14. The structure of claim 1, wherein the conductive lines or conductive features are printed on the vertical layer as metallic traces.

15. The structure of claim 1, wherein the multi-level electronic circuit includes at least one single electronic circuit disposed on multiple levels between multiple instances of the vertical layers.

16. The structure of claim 1, wherein the multi-level electronic circuit comprises multiple transistors and multiple capacitors disposed on multiple levels between multiple instances of the vertical layers.

17. The structure of claim 1, wherein each vertical layer has interconnection circuitry coplanar with the vertical layer, and coplanar faces of the vertical layers are direct bonded together into a laminated stack.

* * * * *